United States Patent [19]

Koetzle

[11] Patent Number: 5,112,516
[45] Date of Patent: May 12, 1992

[54] HIGH TEMPERATURE FLASHPOINT, STABLE CLEANING COMPOSITION

[75] Inventor: A. Richard Koetzle, Rochester, N.Y.

[73] Assignee: William D. Sheldon, III, Rochester, N.Y.

[21] Appl. No.: 640,219

[22] Filed: Jan. 11, 1991

[51] Int. Cl.$^5$ .................. C11D 7/22; C11D 7/32; C11D 7/50

[52] U.S. Cl. .................. 252/162; 252/153; 252/170; 252/171; 252/DIG. 8; 134/38; 134/39; 134/40

[58] Field of Search .............. 252/162, 170, 171, 153, 252/DIG. 8; 134/38, 39, 40

[56] References Cited

U.S. PATENT DOCUMENTS

| | | | |
|---|---|---|---|
| 4,294,729 | 10/1981 | Bakos et al. | 252/171 |
| 4,336,024 | 6/1982 | Denissenko | 8/142 |
| 4,414,128 | 11/1983 | Goffinet | 252/171 |
| 4,576,728 | 3/1986 | Stoddart | 252/547 |
| 4,767,563 | 8/1988 | de Buzzaccarini | 252/174.25 |
| 4,783,283 | 11/1988 | Stoddart | 252/173 |
| 4,797,231 | 1/1989 | Schumann et al. | 252/171 |

OTHER PUBLICATIONS

*Merck's Chemical Index*, p. 8890, definition of Terpineol-No. 8886.
*Merck's Chemical Index*, p. 7248, definitions of Pinene-No. 7242, Pine Oil-No. 7243.

Primary Examiner—A. Lionel Clingman
Assistant Examiner—William S. Parks
Attorney, Agent, or Firm—Joseph W. Berenato, III

[57] ABSTRACT

The present invention relates to a aqueous based micellar solution in the form of a microemulsion which is an effective all-purpose cleaner and which has a flashpoint in excess of its boiling point which is typically greater than 212 degrees Fahrenheit.

20 Claims, No Drawings

HIGH TEMPERATURE FLASHPOINT, STABLE CLEANING COMPOSITION

BACKGROUND OF THE INVENTION

The present invention relates to the subject matter of my application Ser. No. 510,779 filed Apr. 18, 1990 and provides improvements thereon.

Many industrial process cleaning compositions have been based on fluorinated and flourinated/chlorinated solvents. As ecological concerns have risen in importance, the search for replacements for such cleaners has attained increased importance. Several requirements exist for replacement cleaners including cleaning efficacy, non-corrosiveness to metal parts, ease of use, and safety. Safety concerns raise several different requirements, including nontoxicity and high flashpoint. To date no replacement cleaner has attained these properties.

Terpene hydrocarbons have been used for some time in all purpose cleaners and in some specific formulations for specific industrial cleaning purposes, such as cleaning printed circuit boards or removal of graffiti. All of these prior art cleaners have low flash points. However, the basic problems associated with providing an effective and safe industrial cleaner have not been considered or solved using terpene hydrocarbon based cleaning compositions.

SUMMARY OF THE INVENTION

The present invention relates to an aqueous based micellar solution in the form of a microemulsion which is an effective all-purpose cleaner and which has a flashpoint in excess of its boiling point which is typically greater than 212 degrees Fahrenheit.

DETAILED DESCRIPTION OF THE INVENTION

The present invention relates to an improved cleaning composition which provides sufficient cleaning efficacy to be useful in many industrial applications which presently rely on fluorinated or chlorinated/-fluorinated solvents; and which has a flashpoint in excess of 200 degrees Fahrenheit. These improved cleaning compositions comprise:

10 to 35 weight percent terpene alcohol which is free from alpha-pinene and beta-pinene; and from 1 to 35 weight percent of a surfactant or combination of surfactants.

The surfactant or combination of surfactants can comprise up to 35 weight percent of the composition in total, and may be the combination of two or more different types of surfactants. A typical combination may comprise:

1.0 to 35 weight percent nonionic surfactant;
1.0 to 35 weight percent cationic, anionic or zwitterionic surfactant wherein both surfactant components do not include surfactants unreacted with ethylene oxide components. It is very important that any surfactant used in the present invention does not have free ethoxide components which prove to be quite volatile and defeat the objective of obtaining a cleaning composition which is not combustible.

The compositions may also comprise from 0.1 to 25 weight percent terpene hydrocarbon which have been specially prepared so that no significant amount of alpha pinene or beta pinene are present in said terpene hydrocarbon component;

These compositions are further characterized by being clear micellar solutions which are stable to phase changes and dilutions. Repeated freeze/thaw cycle experiments show that the present cleaners do not break into two phase mixtures as many d-limonene based systems demonstrate. For instance, many terpene hydrocarbon/ surfactant systems are emulsion systems which will become cloudy upon dilution with regular water. In some limonene and surfactant based systems dilution causes the cleaning solution to gel. In automated cleaning processes this can be a serious disadvantage as it will cause cleaning apparatus to fail, or the gels formed will not be removed from the article being cleaned.

The cleaning compositions of the present invention are in the form of microemulsions. Microemulsions are two phase mixtures comprising an oil phase and a water phase. Regular emulsions appear cloudy or opaque because the size of the droplets of oil are larger than quarter wavelengths of white light, and thus scatter light rather than allow it to pass through the mixture unscattered. Microemulsions have oil droplets less than about 10 microns in size and thus do not scatter light. They appear clear. Furthermore, microemulsions tend to be much more stable than regular emulsions. True microemulsions are easier to form from their constituent components than regular emulsions. Typically emulsions may need special equipment to be formed such as ultrasonic mixers, or emulsifiers which produce tremendous shear fores. The compositions of the present invention require only standard, non-shear mixing apparatus to be produced.

For purposes of this application terpene hydrocarbon shall be understood to include all compounds of the general structure

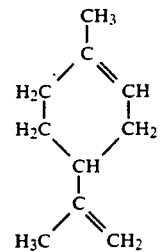

which are monocyclic terpenes, and acylcic terpenes. The terpene hydrocarbons used in the present invention are derived from a number of natural sources. Typically, the terpene hydrocarbon is a blend of naturally occurring terpene compounds. These compounds, include the class of mono- or sesquiterpenes and mixtures thereof and can be acyclic or monocyclic in structure. Acyclic terpene hydrocarbons useful in the present invention include 2-methyl-6-methylene-2,7-octadiene and 2,6-dimethyl-2,4,6octadiene. Monocylic terpene hydrocarbons include terpinene, terpinolene and limonene classes and dipentene. While the examples provided here employ naturally occurring mixtures of these compounds it is understood that pure samples of these compounds could be employed as well. When refined samples of naturally occurring terpene hydrocarbons are employed care must be taken to insure that no significant amount of alpha or beta pinene are present, or that any alpha or beta pinene are removed by means of distillation or filtering.

Specifically excluded from the term "terpene hydrocarbon" are bicyclic terpenes which include alpha and beta pinene, and terpene alcohols.

The term "terpene alcohol" is understood for purposes of the present invention to encompass compounds of the formulae

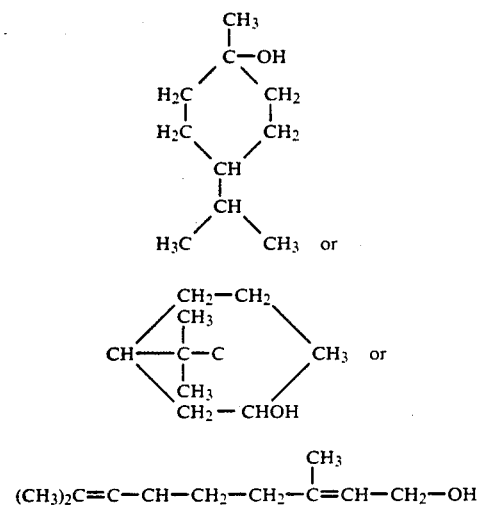

$(CH_3)_2C=C-CH-CH_2-CH_2-\underset{\underset{CH_3}{|}}{C}=CH-CH_2-OH$ which are monocyclic, bicyclic and acyclic alcohols, respectively. Terpene alcohols are structurally similar to terpene hydrocarbons except that the structures also include some hydroxy functionality. They can be primary, secondary, or tertiary alcohol derivatives of monocyclic, bicyclic or acyclic terpenes as well as the above. Such tertiary alcohols include terpineol which is usually sold commercially as a mixture of alpha, beta, and gamma isomers. Linalool is also a commercially available tertiary terpene alcohol. Secondary alcohols include borneol, and primary terpene alcohols include geraniol. Terpene alcohols are generally available through commercial sources, however, one must take care in practicing this invention to insure that no significant amount of alpha pinene or beta pinene are present in the terpene alcohol source, or that care is taken to remove such pinenes.

Examples of nonionic surfactants which are employed include propylene oxide or ethylene oxide condensation products of higher aliphatic alcohols, alkyl phenols, carboxylic acids, amides, amines and sulphonamides. These well known surfactants include the sorbitan esters of fatty acids having 10 to 22 carbon atoms; poloxyethylene sorbitan esters of C10 to C22 fatty acids having up to 95 percent propylene oxide; polyoxyethylene sorbitol esters of C10 to C22 fatty acids, polyoxyethylene derivatives of fatty phenols having 6 to 20 carbon atoms and up to 95 percent propylene oxide; fatty amino and amido betaines having 10 to 22 carbon atoms; polyoxyethylene condensates of C10 to C22 fatty acids or fatty alcohols having up to 95 percent propylene oxide. Polyoxyethylene and polyoxypropylene analogs of the above surfactants can be used in the present invention as long as care is taken to insure that polyoxyethylene polymers or polyoxypropylene polymers which have not been completely reacted with the fatty acid portion of the surfactant. Most importantly, volatile oligomeric fractions must be absent form surfactants used in the present invention. A convenient way this goal can be accomplished is by using oxypropylene analogs of the above mentioned species of surfactants where feasible.

Ionic surfactants employed include surfactants such as the alkylaryl sulfonates of 6 to 20 carbons in the alkyl group; C10 to C22 fatty acids soaps; C10 to C22 fatty sulfates; C10 to C22 alkyl sulfonates; alkali metal salts of dialkyl sulfosuccinates; C10 to C22 fatty amine oxides; fatty imidazolines of C6 to C20 carbon atoms; fatty amido sulfobetaines having 10 to 22 carbon atoms; quaternary surfactants such as the fatty ammonium compounds having 10 to 22 carbon atoms; C10 to C22 fatty morpholine oxides; alkali metal salts of carboxylated ethoxylated C10 to C22 alcohols having up to 95 percent propylene oxide; propylene oxide condensates of C10 to C22 fatty acid monoesters of glycerins having up to 95 percent propylene oxide; the monoor diethanol amides of C1O to C22 fatty acids; and alkoxylated siloxane surfactants containing propylene oxide units and/or propylene oxide units; and phosphate esters, etc.

As is well known in the field of surfactants, the counter ion in the case of anionic surfactants may be any of the alkali metals, ammonia, or substituted ammonias such as trimethylamine or triethanol amine. Usually ammonium, sodium and potassium are preferred. In the case of cationic surfactants, the counter ion is usually a halide, sulfate, or methosulfate, the chlorides being the most common industrially available compounds. The foregoing compounds have been described with particular reference to fatty derivatives. It is the fatty moiety usually forming the lipophilic moiety. A common fatty group is an alkyl group of natural or synthetic origin.

In most instances, the alkyl group may be replaced by the corresponding ethylenically saturated group having one or more ethylene linkages such as commonly occur in nature. Common unsaturated groups are oleyl, linoleyl, decenyl, hexadecenyl, dodecenyl, etc. In appropriate cases, as known in the art, the alkyl group may be cyclic, i.e., cycloalkyls, or may be straight or branched chain. Other suitable surfactants include sorbitol monolaurate-propylene oxide condensates; sorbitol monomyristate-propylene oxide condensates; sorbitol monostearate-propylene oxide condensates; dodecylphenol-propylene oxide condensates; myristylphenol-propylene oxide condensates; octylphenylpropylene oxide condensates; nonylphenyl-propylene oxide condensates; stearylphenol-propylene oxide condensates; lauryl alcohol-propylene oxide condensates; stearyl alcoholpropylene oxide condensates; secondary alcohol-propylene oxide condensates such as C14-C15 secondary alcohols condensed with propylene oxide; decyl amino betaine; coco amido sulfobetaine; oleyl amido betaine; coco imidazoline; coco sulfoimidazoline; cetyl imidazoline; 1-hydroxyethyl-2-heptadecenyl imidazoline; 1-hydroxyethyl-2mixed heptadecenyl heptadecadienyl imidazoline; n-coco morpholine oxide; decyl dimethyl amine oxide; coco amido dimethyl amine oxide; sorbitan tristearate condensed with propylene oxide; sorbitan trioleate condensed with propylene oxide; sorbitan trioleate; sodium or potassium dodecyl sulfate; sodium or potassium stearyl sulfate; sodium or potassium dodecyl benzene sulfonate; sodium or potassium stearyl sulfonate; triethanol amine salt of dodecyl sulfate; trimethyl dodecyl ammonium chloride; trimethyl stearyl ammonium methosulfate; sodium laurate; sodium or potassium myristate; and sodium or potassium stearate.

Optionally, the cleaning compositions of the present invention may also include a suitable solvent for specific cleaning purposes. Such solvents include n-methyl pyrrolidone, dipropylene glycol and ethylene glycol monobutyl ether.

All of the chemical components used in the present invention are commercially available.

EXAMPLES

The following examples illustrate certain aspects of the present invention. They are not intended to exemplify the full scope of the invention. In certain aspects they enable certain aspects of the invention.

EXAMPLE 1

The following ingredients in the following proportions were combined and mixed:

| Ingredient | Volume | Wt. % |
|---|---|---|
| $H_2O$ | 175 | 35.0 |
| monoethanolamine | 7.5 | 1.5 |
| dodecylbenzene sulfonic acid | 13.0 | 2.6 |
| nonylphenoxy polyethoxy ethanol | 38.5 | 7.7 |
| dipropylene glycol | 38.5 | 7.7 |
| sodium xylene sulfonate | 11.5 | 2.3 |
| e.d.t.a. | 4.0 | 0.8 |
| terpeniol | 62.0 | 12.4 |
| assorted terpene alcohols | 35.0 | 7.0 |
| n-methy pyrrolidone | 115 | 23.0 |
| | | 100.0% |

The combination was clear and stable. When tested it exhibited a flash point in excess of 212 degrees Fahrenheit. In fact it exhibited no flash point below the boiling point of the composition.

EXAMPLE 2

A mixture of the following components

| Ingredient | Volume | Wt. % |
|---|---|---|
| $H_2O$ | 545 | 54.2 |
| monoethanolamine | 20 | 2.0 |
| dodecylbenzene sulfonic acid | 35.0 | 3.5 |
| nonylphenoxy polyethoxy ethanol | 100 | 10.0 |
| terpeniol | 93.0 | 9.3 |
| assorted terpene alcohols | 52.5 | 6.0 |
| n-methy pyrrolidone | 150 | 15.0 |

The components formed a clear microemulsion with mixing. The composition had a flash point in excess of 212 degrees Fahrenheit.

EXAMPLE 3

| Ingredient | Volume | Wt. % |
|---|---|---|
| terpeniol | 200 | 33.33 |
| n-methy pyrrolidinone | 200 | 33.33 |
| dipropylene glycol | 200 | 33.33 |

This clear mixture was clear, stable and had a flash point in excess of 212 degrees Fehrenheit.

EXAMPLE 4

Another sample was made with the following composition.

| Ingredient | Volume (ml) | Wt. % |
|---|---|---|
| $H_2O$ | 470 | 47.0 |
| dodecyl benzene sulfonic acid | 35.5 | 3.5 |
| ethylene glycol monobutyl ether (EB) | 100 | 10.0 |
| Rexol 25/10 | 100 | 10.0 |
| sodium xylene sulfonate | 30 | 3.0 |
| e.d.t.a. | 10 | 1.0 |
| terpeniol | 250 | 25.0 |
| 1 N NaOH | 4.5 | 0.5 |
| | | 100.0 |

The solution was adjusted to a pH between about 6 and 8. This solution was clear and stable. The solution did not flash below its boiling point.

EXAMPLES 5-7

Clear stable microemulsions of the following formulations were made, all of which displayed flashpoints in excess of 212 degrees Fahrenheit.

EXAMPLE 5

| Ingredient | volume (ml) | vol. % |
|---|---|---|
| $H_2O$ | 415 | 41.5 |
| monethanolamine | 15 | 1.5 |
| dodecylbenzene sulfonic acid | 26 | 2.6 |
| nonylphenoxy polyethoxy ethanol | 77 | 7.7 |
| dipropylene glycol | 77 | 7.7 |
| sodium xylene sulfonate | 30 | 3.0 |
| ethylene diamine tetraacetic acid | 10 | 1.0 |
| terpeniol | 250 | 25.0 |
| n-methyl pyrrolidone | 100 | 10.0 |

EXAMPLE 6

| Ingredient | volume (ml) | vol. % |
|---|---|---|
| $H_2O$ | 545 | 54.5 |
| monethanolamine | 15 | 1.5 |
| dodecylbenzene sulfonic acid | 26 | 2.6 |
| sodium metasilicate | 10 | 1.0 |
| nonylphenoxy polyethoxy ethanol | 77 | 7.7 |
| dipropylene glycol | 77 | 7.7 |
| sodium xylene sulfonate | 30 | 3.0 |
| ethylene diamine tetraacetic acid | 10 | 1.0 |
| terpeniol | 150 | 15.0 |
| n-methyl pyrrolidone | 50 | 5.0 |

EXAMPLE 7

| Ingredient | volume (ml) | vol. % |
|---|---|---|
| $H_2O$ | 495 | 49.5 |
| monethanolamine | 15 | 1.5 |
| dodecylbenzene sulfonic acid | 26 | 2.6 |
| sodium metasilicate | 10 | 1.0 |
| nonylphenoxy polyethoxy ethanol | 77 | 7.7 |
| dipropylene glycol | 77 | 7.7 |
| sodium xylene sulfonate | 30 | 3.0 |
| ethylene diamine tetraacetic acid | 10 | 1.0 |
| terpeniol | 200 | 20.0 |

-continued

| Ingredient | volume (ml) | vol. % |
| --- | --- | --- |
| n-methyl pyrrolidone | 50 | 5.0 |

I claim:
1. A cleaning composition comprised of:
   10 to 35 weight percent terpene alcohol, wherein said terpene alcohol contains no significant amount of alpha pinene or beta pinene;;
   1 to 35 weight percent of a surfactant; and the balance of said composition being water.
2. The composition of claim 1 wherein said cleaning composition also comprises form 1 to 35 weight percent of a cleaning solvent with a flash point greater than 100 degrees Centigrade.
3. The composition of claim 1 wherein the composition further comprises from 0.1 to 35 weight percent terpene hydrocarbon which is substantially free from alpha-pinene or beta-pinene.
4. The composition of claim 1 wherein said surfactant is a mixture comprised of a first surfactant which is a nonionic surfactant and a second surfactant which is an ionic surfactant wherein said surfactant mixture is capable of forming a clear microemulsion with said terpene alcohol in water.
5. The composition of claim 4 which further includes a cleaning solvent chosen form the group consisting of n-methyl pyrrolidone dipropylene glycol and ethylene glycol monobutlyl ether acetate.
6. The composition of claim 4 wherein said second ionic surfactant is dodecylbenzene sulfonic acid.
7. The composition of claim 4 wherein said second ionic surfactant is sodium xylene sulfonate.
8. The composition of claim 2 wherein the cleaning solvent is chosen from the group consisting of n.methyl pyrrolidinone, dipropylene glycol and ethylene glycol monobutyl ether.
9. A microemulsion cleaning composition having a flash point in excess of its boiling point, the compostion comprising:
   a) from about 10 to about 35 weight percent of a terpene alcohol, said alcohol being free of alpha and beta pinene;
   b) from about 1 to about 35 weight percent of a surfactant containing no free ethoxide components; and,
   c) water.
10. The composition of claim 9, wherein:
    a) said surfactant includes a mixture of first and second surfactants, one of said surfactants being ionic and the other of said surfactants being non-ionic.
11. The composition of claim 9, further comprising:
    a) a coupling agent selected from the group consisting of N-methyl pyrrolidone, dipropylene glycol, and ethylene glycol monobutyl ether acetate.
12. The composition of claim 10, wherein:
    said ionic surfactant is selected from the group consisting of dodecylbenzene sulfonic acid and sodium xylene sulfonate.
13. The composition of claim 9, further comprising:
    a) from about 1 to about 35 weight percent of a cleaning solvent having a flash point no less than the boiling point of the microemulsion cleaning composition.
14. The composition of claim 13, wherein:
    a) said solvent is N-methyl pyrrolidone.
15. The composition of claim 9, further comprising:
    a) from about 0.1 to about 25 weight percent of a terpene hydrocarbon, said hydrocarbon being substantially free from alpha and beta pinene.
16. An aqueous based micellar microemulsion cleaning composition, comprising:
    a) from about 10 to about 35 weight percent of a terpene alcohol free from alpha and beta pinene;
    b) from about 1 to about 35 weight percent of a surfactuant mixture comprising a first surfactant which is non-ionic and a second surfactant selected from the group consisting of cationic, anionic, and zwitterionic surfactants and each surfactant of said mixture being free from free ethoxide components; and,
    c) water.
17. The composition of claim 16, further comprising:
    a) from about 0.1 to about 25 weight percent of a terpene hydrocarbon free from alpha and beta pinene.
18. The composition of claim 17, wherein:
    a) said alcohol is selected from the group consisting of monocyclic, bicyclic, and acyclic alcohols.
19. The composition of claim 18, wherein:
    a) said hydrocarbon is selected from the group consisting of mono- and sesqui- terpenes.
20. The composition of claim 16, wherein:
    a) said first surfactant comprises from about 1.0 to about 35 weight percent, and said second surfactant comprises from about 1.0 to about 35 weight percent.

* * * * *